Sept. 23, 1969 R. C. MARTIN 3,468,728

METHOD FOR FORMING OHMIC CONTACT FOR A SEMICONDUCTOR DEVICE

Filed Jan. 14, 1965 3 Sheets-Sheet 1

Robert C. Martin
INVENTOR

BY John W. Graham

Robert C. Martin
INVENTOR.

BY John D. Graham

Robert C. Martin
INVENTOR.

BY John W. [signature]

United States Patent Office 3,468,728

Patented Sept. 23, 1969

3,468,728
METHOD FOR FORMING OHMIC CONTACT FOR A SEMICONDUCTOR DEVICE

Robert Clurin Martin, Dallas, Tex., assignor to Texas Instruments Incorporated, Dallas, Tex., a corporation of Delaware Filed Jan. 14, 1965, Ser. No. 425,542
Int. Cl. H01l 7/44; H05h 3/00
U.S. Cl. 148—187 4 Claims

ABSTRACT OF THE DISCLOSURE

Disclosed is a method for forming an ohmic contact to a small geometry region in a semiconductor integrated circuit by using an insulating layer of different thicknesses. The insulating layer is formed on the integrated circuit with the portion of the insulating layer over the region being thinner than the rest of the insulating layer. During the formation of an opening in the insulating layer the unmasked thinner insulating layer is completely removed while the unmasked thicker insulating layer is only partially removed. A metal contact is then formed on the exposed portion of the region.

This invention relates to miniaturized electronic circuits integrated in a semiconductor body, and in particular, to resistors utilized in integrated circuits and a method for providing ohmic contacts to integrated circuit elements such as resistors.

Integrated circuits are the most advanced means for miniaturizing electronic circuits. In integrated circuits both active and passive circuit elements are incorporated within one semiconductive body.

A resistor for an integrated circuit is formed by the diffusion of doping impurities into a semiconductor body in a defined pattern. Subsequently, a protective coating, such as silicon oxide for example, may be formed over the diffused resistor. Photomasking and etching techniques are employed to remove selected portions of the protective coating so that ohmic contacts to the resistor can be made. Heretofore, the resistor has been enlarged near the contact area to allow for photomask line-up clearance or tolerance around the contact area and thus ensure adequate contact surface on the resistor.

There are several inherent disadvantages with the present integrated circuit resistors. Each resistor requires more space on the semiconductor body because of the enlarged contact regions. Also, the enlarged contact regions increase the resistor-substrate capacitance. Resistors with multiple contacts are less accurate because of the varying cross-sectional areas. This latter disadvantages is especially important where master patterns are utilized in producing integrated circuits. In order to reduce the costs of integrated circuits, master photomasking patterns are used to produce semiconductor wafers with a number of active and passive elements therein. By varying only the masking and etching for the conductive leads and ohmic contacts, any one of a variety of circuits can be obtained from each wafer. Each wafer has several resistive elements from which a wide range of resistance values can be obtained by selectively placing the resistor contacts.

A principal object of this invention is to provide a method for making ohmic contacts to integrated circuit elements in which photomask line-up tolerance is not critical.

Another object of this invention is to provide a method for making ohmic contact to an integrated circuit resistor without the need for enlarging the resistor contact area.

Still another object of this invention is to improve the geometry of integrated circuit resistors.

Features of this invention are the increased accuracy of integrated circuit resistors and the reduced capacitance between resistor and substrate.

In accordance with this invention, integrated circuit resistors can be made with uniform cross-sectional areas. The photo-mask used in making a contact surface on a resistor or other integrated circuit element provides an area for etching that is wider than the desired contact surface width, thus allowing for the mask line-up clearance. Because the protective coating, silicon oxide for example, is thinner over the desired contact surface than over the adjacent semiconductor wafer surface, controlled etching can remove the protective coating from the contact surface while sufficient protective coating will remain adjacent thereto to prevent the contact from shorting to the substrate. Contact to a resistor is possible by removing the protective coating from across the resistor at any point. These same principles can of course be used to make contacts to elements other than resistors.

The objects and features of the invention will become more readily understood from the following detailed description and appended claims when taken in conjunction with the accompanying drawing, in which:

Figure 2:
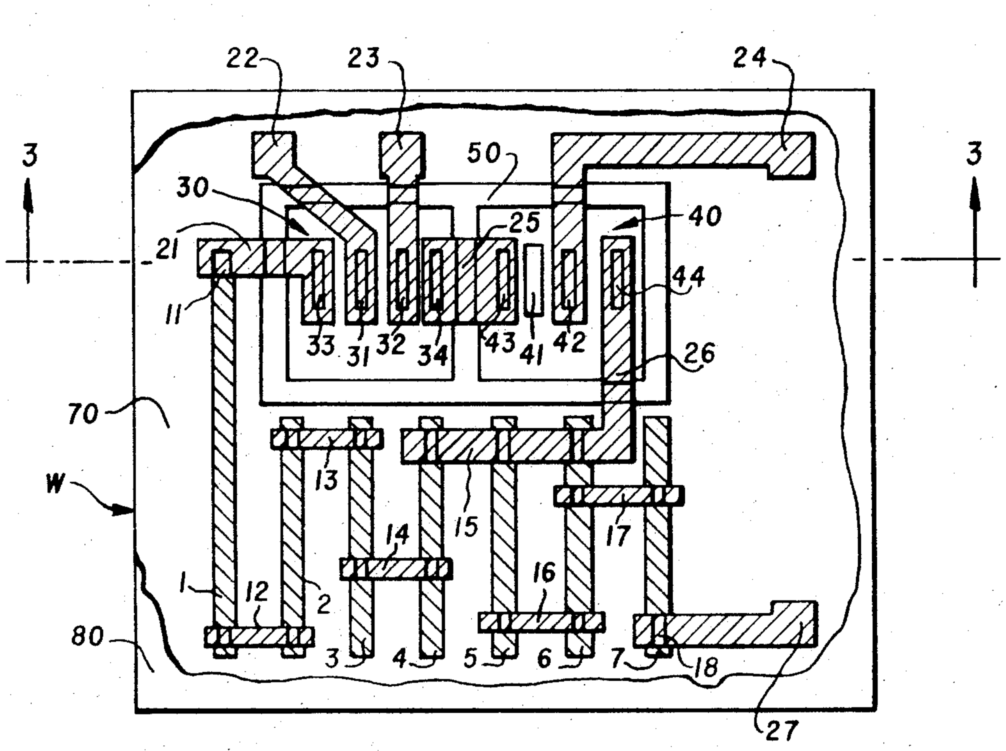
FIGURE 2 is a plan view, depicting the layout of all circuit elements, of the circuit of FIGURE 1 integrated in a semiconductor wafer.
Figure 3A:
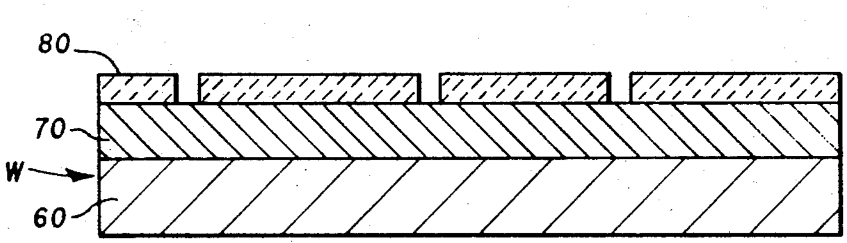
Figure 3B:
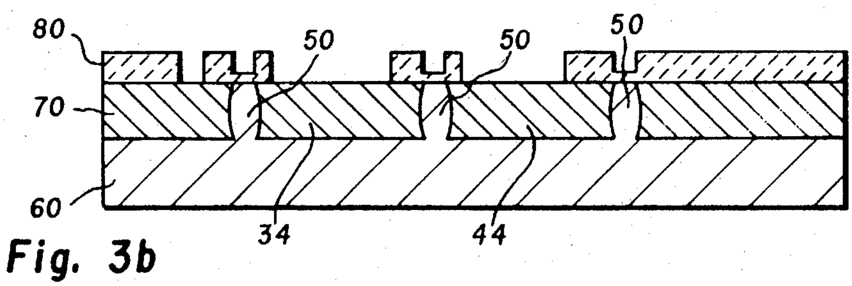
Figure 3C:
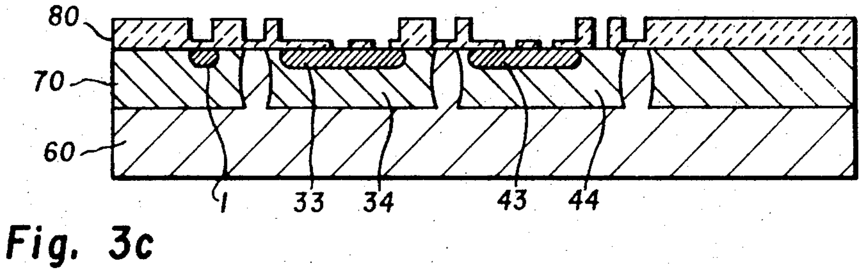
Figure 3D:
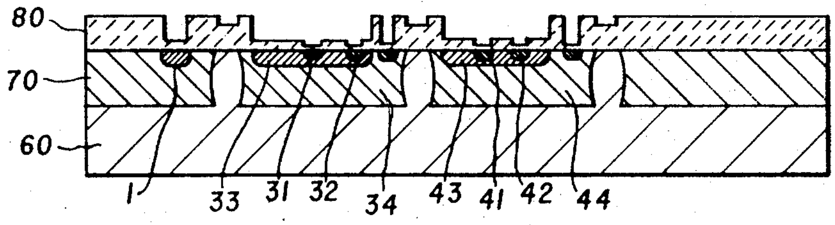
Figures 3E, 3F:
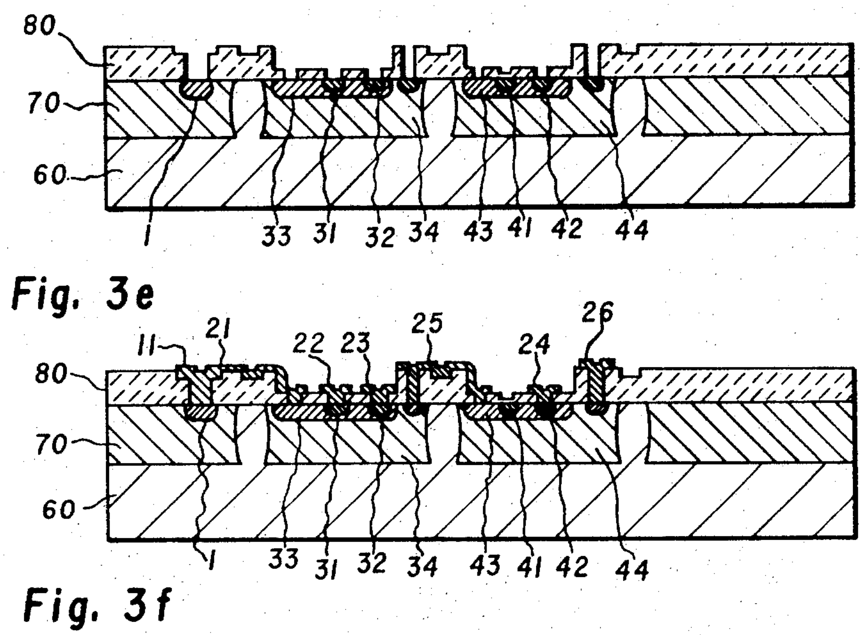
Figure 3G:
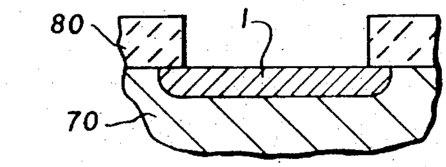
Figure 3H:
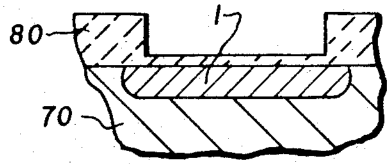
Figure 3I:
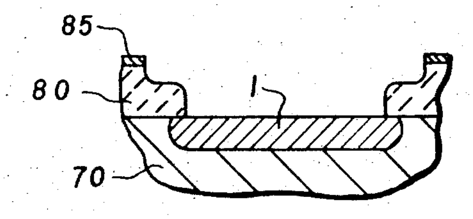

FIGURES 3*a*–3*f* are cross-sectional views, taken along the sectional line 3—3 of FIGURE 2, of the semiconductor wafer during fabrication of the integrated circuit in accordance with this invention, and FIGURES 3*g*–3*i* are enlarged cross-sectional views of a resistive element showing the steps in providing a contact surface on the resistive element in accordance with this invention.

Figure 1:
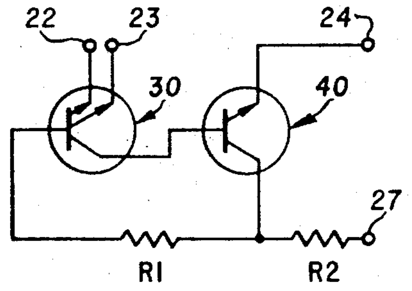
FIGURE 1 is a schematic diagram of an electronic circuit.

Referring now to FIGURE 1, it will be noted that therein is shown a dual input gate circuit in which the contacts 22 and 23 are inputs to the dual emitter transistor 30 and the contact 24 is an output from the emitter follower transistor 40. The base of transistor 30 is connected through the series-connected resistors $R_1$ and $R_2$ to the voltage source contact 27. The collector of the transistor 40 is ohmically connected to the common point of resistors $R_1$ and $R_2$, and the base of the transistor 40 is ohmically connected to the collector of the transistor 30.

In FIGURE 2, depicting the circuit of FIGURE 1 integrated in a semiconductor wafer W, the semiconductor wafer W includes the two dual emiter transistors 30 and 40 and the resistor elements 1–7. The resistors $R_1$ includes portions of the resistive elements 1–4 which are connected by the ohmic leads 12–14. The resistor $R_2$ includes portions of the resistive elements 5–7 which are connected by the ohmic leads 16 and 17. The common ohmic lead 15 of the series-connected resistors $R_1$ and $R_2$ is connected through the ohmic lead 26 to the collector 44 of the transistor 40. The ohmic lead 27 is connected to the ohmic contact 18 on the resistive element 7, and the resistive element 1 is connected at the contact 11 through the ohmic lead 21 to the base 33 of the transistor 30. The ohmic leads 22 and 23 are connected to the emitters 31 and 32, respectively, of the transistor 30, and the collector 34 of the transistor 30 is ohmically connected through the lead 25 to the base 43 of the transistor 40. The emitter 42 of the transistor 40 is ohmically contacted to the lead 24. The emitter 41 of the transistor 40 is not utilized in this circuit. The region 50 electrically isolates the transistor 30 and the transistor 40.

The utility of the present invention in integrated circuit production can be seen with reference to FIGURES 3*a*–3*f* which illustrate the steps in producing the embodiment of FIGURE 2. Master photomasking patterns can be used in forming the transistors 30 and 40 and the resistive elements 1–7. Only two special photomasking patterns are needed to provide the ohmic contacts and leads and thus complete the circuit. Photomasking, etching and diffusion techniques are well known in the art; and since the techniques are not part of the invention, the techniques are not discussed in detail herein. The figures are drawn out of proportion in order to depict all details of the circuit fabrication.

FIGURE 3*a* shows the wafer W with a P-type silicon substrate 60, an N-type epitaxial layer 70 and a silicon oxide layer 80. The first silicon oxide removal is performed which creates the openings through the silicon oxide layer 80 for the diffusion of the isolating P-type region 50.

In FIGURE 3*b* the isolating P-type region is formed by diffusing a P-type dopant through the N-type epitaxial layer 70 thus defining the transistor collector regions 34 and 44. Silicon oxide is formed in the openings in the silicon oxide layer 80 and a second silicon oxide removal forms openings through the silicon oxide layer 80 for the diffusion of the transistor base regions and the resistive elements.

In FIGURE 3*c* a P-type dopant is again diffused through the silicon oxide layer 80 thus forming the P-type transistor base regions 33 and 43 in the collector regions 34 and 44, respectively, and resistive element 1 in the epitaxial layer 70. The resistor elements 2–7, not shown, are also formed by this diffusion. Referring back to FIGURE 2 it will be seen that all resistive elements have uniform widths with no enlarged regions for contact surfaces. The ohmic values of the resistive elements are determined, of course, by the width and length of the diffused elements and by the doping impurity concentration. Silicon oxide is again formed in the openings in the silicon oxide layer 80, and a third silicon oxide removal forms openings in the silicon oxide layer 80 for the diffusion of the transistor emitter regions and for access to the transistor collector regions. It is to be noted that the silicon oxide over the resistive element 1 is not so thick as the silicon oxide immediately adjacent thereto. This is an important feature in the practice of this invention.

In FIGURE 3*d*, an N-type dopant is diffused through the silicon oxide layer 80 forming the N-type emitter regions 31 and 32 in the base region 33 and the N-type emitter regions 41 and 42 in the base region 43. N-type diffusion also occurs in the already N-type collector regions 34 and 44. Silicon oxide is again formed in all openings in the silicon oxide layer 80. At this point all active and passive elements have been formed by using master photomask patterns. Two special photomask patterns can now be used in providing the ohmic contacts and leads peculiar to the desired circuit.

In FIGURE 3*e* a special photomask is used to provide contact surfaces on the circuit elements. A contact surface is not provided on the emitter 41 since it is not needed in this circuit. The contact surfaces on the resistive elements 1–7 are selected to give the desired ohmic values for the resistors $R_1$ and $R_2$. Note in FIGURE 3*e* that the silicon oxide is not only removed from the resistive element 1 to allow for the contact 11 thereon, but also from the silicon oxide layer 80 adjacent to the resistor element 1. This excess removal of silicon oxide is required to insure adequate contact surface on the resistor element 1 despite photomask lineup tolerances. Since the silicon oxide thickness adjacent to the resistive element 1 is greater than the silicon oxide thickness removed, the substrate area immediately adjacent to the area for contact 11 on resistive element 1 remains protected by silicon oxide. Though not shown in FIGURE 3*e*, this novel technique for providing a contact surface can be utilized in providing the contact surfaces to the transistor elements, particularly the emitters which are the smallest diffused regions.

In FIGURE 3*f* contacts and leads are formed by depositing a metal vapor on the wafer surface, masking the desired metal, and removing the unwanted metal by etching. Another special photomask is used in the masking of the desired metal. Shown in FIGURE 3*f* are the contact 11 and the ohmic leads 21–26.

The novel technique for providing the contact surface on the resistive element 1 for the ohmic contact 11 may be better visualized with reference to FIGURES 3*g*–3*i*. Shown are enlarged cross-sectional views of the resistive element 1 taken along the sectional line 3—3 of FIGURE 2. In FIGURE 3*g* the resistive element 1 is formed by diffusing a dopant through the opening in the silicon oxide layer 80 into the epitaxial layer 70. Note that the dopant diffuses under each side of the silicon oxide layer 80 thus creating a doped region which is wider than the width of the opening in the silicon oxide layer 80.

In FIGURE 3*h* silicon oxide is re-formed above the resistive element 1 in the opening in the silicon oxide layer 80. The thickness of the silicon oxide above the resistive element 1 may be only about one-fifth the thickness of the silicon oxide layer 80 adjacent thereto.

In FIGURE 3*i* a contact surface is provided by masking the silicon oxide layer 80 with an etch resistant coating 85 except for an exposed strip of the silicon oxide layer 80 extending laterally across the desired contact surface on the resistive element 1. The criticality of photomask line-up tolerance in providing an adequate contact surface is reduced because the unmasked strip on the silicon oxide layer is wider than the desired contact surface width by more than twice the line-up tolerance. An etchant is applied to remove the unmasked silicon oxide. The etching process is controlled so that all the silicon oxide on the contact surface of the resistive element 1 is removed, but the substrate adjacent to the contact surface remains covered by the silicon oxide layer 80. The etching process also increases the width of the opening in the silicon oxide layer 80. However, the exposed contact surface remains entirely on the resistive element 1 because the doped region is wider than the opening in the silicon oxide layer 80.

The novel method for providing contacts to integrated circuit resistors illustrated herein permits improved resistor geometries. As exemplified in the resistors $R_1$ and $R_2$ in the above-illustrated embodiment, resistors with uniform cross-sectional areas can be utilized. The accuracy of resistors with multiple contacts is improved. Since enlarged resistor portions are not required for line-up clearance around the resistor contact area, the resistor-substrate capacitance is reduced. While only resistor contacts have been illustrated herein, contacts to other integrated circuit elements, such as transistors, can be provided in a similar manner.

We claim:

1. A method of fabricating ohmic contacts for a semiconductor device of the type having a plurality of regions formed in a body of semiconductor material and extending to one surface thereof, comprising the steps of:

forming insulating layers of different thicknesses on said surface of said semiconductor body, the insulating layer on said regions being thinner than the thicker insulating layer adjacent said regions, forming a mask having a plurality of openings on said insulating layers, each opening exposing a portion of said thinner and a portion of said thicker insulating layers, etching the unmasked portions of said insulating layers for a period of time sufficient to remove all of the unmasked portions of said thinner insulating layer but for a period of time insufficient to remove all of the unmasked portions of said thicker insulating layer, thereby forming an opening to expose portions of the surfaces of selected regions, removing said mask, and forming metal contacts on said exposed surfaces of said selected regions, thereby making ohmic contacts to said regions.

2. The method as defined in claim 1, wherein said insulating layers are silicon oxide.

3. A method of fabricating ohmic contacts to a resistor formed in a body of semiconductor material of one conductivity type and extending to a surface thereof, comprising the steps of:

forming a first insulating layer on said surface, forming a first opening in said first insulating layer to expose a portion of said surface, diffusing impurities of opposite conductivity type into said exposed surface portion to form said resistor, the diffusion forming a second insulating layer on said exposed surface portion, said second insulating layer being thinner than said first insulating layer, forming a mask on said first and said second insulating layers, said mask having openings exposing a portion of said second insulating layer over each end of said resistor and a portion of said first insulating layer adjacent said each end, etching the unmasked portions of said first and said second insulating layers for a period of time sufficient to remove all of the unmasked portion of said second insulating layer but for a period of time insufficient to remove all of the unmasked portion of said first insulating layer, thereby forming openings to expose portions of the surface of said resistor at said each end of said resistor, removing said mask, forming metal contacts on said exposed surface of said resistor, thereby making ohmic contacts to said resistor.

4. The method as defined in claim 3, wherein said first and said second insulating layers are silicon oxide and said body of semiconductor material is silicon.

References Cited

UNITED STATES PATENTS

| | | | |
|---|---|---|---|
| 3,300,339 | 1/1967 | Perri, et al. ------ | 117—212 X |
| 3,258,606 | 6/1966 | Meadows. | |
| 2,995,473 | 8/1961 | Levi ------------ | 117—212 X |

ALFRED L. LEAVITT, Primary Examiner

A. G. GRIMALDI, Assistant Examiner

U.S. Cl. X.R.

29—578, 590; 117—212; 156—17; 317—234